(12) United States Patent
Cheng et al.

(10) Patent No.: US 9,472,616 B2
(45) Date of Patent: Oct. 18, 2016

(54) UNDERCUT INSULATING REGIONS FOR SILICON-ON-INSULATOR DEVICE

(71) Applicant: International Business Machines Corporation, Armonk, NY (US)

(72) Inventors: Kangguo Cheng, Schnectady, NY (US); Bruce B. Doris, Slingerlands, NY (US); Balasubramanian Pranatharthiharan, Watervliet, NY (US); Shom Ponoth, Clifton Park, NY (US); Theodorus E. Standaert, Clifton Park, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/861,207

(22) Filed: Sep. 22, 2015

(65) Prior Publication Data

US 2016/0013269 A1    Jan. 14, 2016

Related U.S. Application Data

(62) Division of application No. 13/537,141, filed on Jun. 29, 2012, now Pat. No. 9,214,378.

(51) Int. Cl.
*H01L 21/84* (2006.01)
*H01L 29/06* (2006.01)
(Continued)

(52) U.S. Cl.
CPC ..... *H01L 29/0649* (2013.01); *H01L 21/76232* (2013.01); *H01L 21/84* (2013.01);
(Continued)

(58) Field of Classification Search
CPC ............. H01L 21/84; H01L 21/76232; H01L 27/1203; H01L 21/32137; H01L 29/945; H01L 27/1087; H01L 29/66181
USPC .......... 257/347, E21.409, E29.255; 438/296, 438/479, 386
See application file for complete search history.

(56) References Cited

U.S. PATENT DOCUMENTS 4,454,449 A * 6/1984 Hall ........................ H01J 11/12
313/584
5,616,513 A    4/1997 Shepard
(Continued)

FOREIGN PATENT DOCUMENTS

JP    10056059 A    2/1998

OTHER PUBLICATIONS

International Search Report and Written Opinion dated May 14, 2014 for Application No. PCT/US14/14388.

*Primary Examiner* — David Vu
*Assistant Examiner* — Mouloucoulaye Inoussa
(74) *Attorney, Agent, or Firm* — Cantor Colburn LLP; Steven Meyers

(57) ABSTRACT

A method of making a silicon-on-insulator (SOI) semiconductor device includes etching an undercut isolation trench into an SOI substrate, the SOI substrate comprising a bottom substrate, a buried oxide (BOX) layer formed on the bottom substrate, and a top SOI layer formed on the BOX layer, wherein the undercut isolation trench extends through the top SOI layer and the BOX layer and into the bottom substrate such that a portion of the undercut isolation trench is located in the bottom substrate underneath the BOX layer. The undercut isolation trench is filled with an undercut fill comprising an insulating material to form an undercut isolation region. A field effect transistor (FET) device is formed on the top SOI layer adjacent to the undercut isolation region, wherein the undercut isolation region extends underneath a source/drain region of the FET.

7 Claims, 14 Drawing Sheets

(51) Int. Cl.
*H01L 27/12* (2006.01)
*H01L 21/762* (2006.01)
*H01L 29/417* (2006.01)
*H01L 29/78* (2006.01)

(52) U.S. Cl.
CPC ....... *H01L27/1203* (2013.01); *H01L 29/0653* (2013.01); *H01L 29/41766* (2013.01); *H01L 29/78* (2013.01)

(56) References Cited

U.S. PATENT DOCUMENTS

| | | | |
|---|---|---|---|
| 5,902,127 A | 5/1999 | Park | |
| 5,943,578 A | 8/1999 | Katakabe et al. | |
| 6,110,797 A | 8/2000 | Perry et al. | |
| 6,214,698 B1 | 4/2001 | Liaw et al. | |
| 6,242,788 B1 | 6/2001 | Mizuo | |
| 6,251,744 B1 | 6/2001 | Su et al. | |
| 6,255,184 B1 | 7/2001 | Sune | |
| 6,326,261 B1 | 12/2001 | Tsang et al. | |
| 6,399,449 B1 | 6/2002 | Matsumoto | |
| 6,413,835 B1 | 7/2002 | Norstrom et al. | |
| 6,426,252 B1 | 7/2002 | Radens et al. | |
| 6,472,702 B1 | 10/2002 | Shen | |
| 6,531,377 B2 | 3/2003 | Knorr et al. | |
| 6,566,177 B1 | 5/2003 | Radens et al. | |
| 6,667,226 B2 | 12/2003 | Pinto et al. | |
| 6,690,080 B2 | 2/2004 | Norstrom et al. | |
| 6,797,579 B2 | 9/2004 | Yoo et al. | |
| 6,890,833 B2 | 5/2005 | Belyansky et al. | |
| 7,078,324 B2 | 7/2006 | Dudek et al. | |
| 7,217,604 B2 | 5/2007 | Furukawa et al. | |
| 7,326,983 B2 | 2/2008 | Steegen et al. | |
| 7,446,018 B2 | 11/2008 | Brogan et al. | |
| 7,579,255 B2 | 8/2009 | Pyi | |
| 7,625,776 B2 | 12/2009 | Wells et al. | |
| 7,723,172 B2 | 5/2010 | Ishiguro | |
| 7,750,412 B2 | 7/2010 | Rinehimer | |
| 7,871,893 B2 | 1/2011 | Costrini et al. | |
| 7,902,608 B2 | 3/2011 | Anderson et al. | |
| 7,923,786 B2 | 4/2011 | Steegen et al. | |
| 8,293,615 B2 | 10/2012 | Cheng et al. | |
| 8,445,356 B1 | 5/2013 | Cai et al. | |
| 8,525,292 B2 | 9/2013 | Cheng et al. | |
| 8,536,018 B1 | 9/2013 | Anderson et al. | |
| 8,617,940 B2 | 12/2013 | Kurz et al. | |
| 8,623,732 B2 | 1/2014 | Grote et al. | |
| 8,664,742 B2 | 3/2014 | Wells et al. | |
| 8,673,738 B2 | 3/2014 | Doris et al. | |
| 9,105,691 B2 * | 8/2015 | Cheng | H01L 21/84 |
| 2003/0104658 A1 * | 6/2003 | Furukawa | H01L 21/76262 438/151 |
| 2006/0105536 A1 | 5/2006 | Cheng et al. | |
| 2007/0102769 A1 | 5/2007 | Chuang et al. | |
| 2008/0258268 A1 | 10/2008 | Cheng | |
| 2009/0230471 A1 * | 9/2009 | Li | H01L 21/32137 257/347 |
| 2010/0038744 A1 | 2/2010 | Li et al. | |
| 2010/0065941 A1 | 3/2010 | Wells et al. | |
| 2010/0102373 A1 | 4/2010 | Li et al. | |
| 2010/0258869 A1 | 10/2010 | Morita et al. | |
| 2011/0309333 A1 | 12/2011 | Cheng et al. | |
| 2012/0168863 A1 | 7/2012 | Zhu et al. | |
| 2012/0261792 A1 | 10/2012 | Cheng et al. | |

* cited by examiner

UNDERCUT INSULATING REGIONS FOR SILICON-ON-INSULATOR DEVICE

PRIORITY

This application is a divisional of U.S. patent application Ser. No. 13/537,141, filed Jun. 29, 2012, the disclosure of which is incorporated by reference herein in its entirety.

BACKGROUND

This disclosure relates generally to semiconductor devices, and more particularly, to the formation of silicon-on-insulator (SOI) devices.

An SOI substrate includes a bottom substrate underneath a buried oxide (BOX) layer, with a top layer of a semiconductor material located over the BOX. Active devices, such as field effect transistors (FETs), may be formed in the top semiconductor layer on top of the BOX. The presence of the BOX in an SOI device may produce a relatively fast FET device by reducing the capacitance between the source/drain regions of the FET devices on the top semiconductor layer and the bottom substrate. The channel regions of the FET devices, which are located between the source/drain regions, may be decoupled from the bottom substrate by the BOX, allowing movement of the channel region potential with respect to the bottom substrate. For example, when the channel region potential floats positive, the threshold voltage of the FET drops, thereby increasing the FET device drive current.

A difficulty encountered with SOI devices is determining an appropriate BOX thickness. The capacitance between the source/drain regions and the bottom substrate increases as the thickness of the BOX layer is decreased, which may increase the circuit loading. However, the amount of channel region potential movement increases with increasing thickness of the BOX layer due to the reduced capacitance coupling to the substrate, which may result in floating channel regions. A floating channel region may have the effect of producing a fluctuating FET threshold voltage, and therefore an unpredictable device. UTBB (ultra-thin body and BOX) devices may have a relatively thin BOX layer, preventing floating channel regions in a UTBB SOI device.

SUMMARY

In one aspect, a method of making a silicon-on-insulator (SOI) semiconductor device includes etching an undercut isolation trench into an SOI substrate, the SOI substrate comprising a bottom substrate, a buried oxide (BOX) layer formed on the bottom substrate, and a top SOI layer formed on the BOX layer, wherein the undercut isolation trench extends through the top SOI layer and the BOX layer and into the bottom substrate such that a portion of the undercut isolation trench is located in the bottom substrate underneath the BOX layer. The undercut isolation trench is filled with an undercut fill comprising an insulating material to form an undercut isolation region. A field effect transistor (FET) device is formed on the top SOI layer adjacent to the undercut isolation region, wherein the undercut isolation region extends underneath a source/drain region of the FET.

In another aspect, a silicon-on-insulator (SOI) semiconductor device includes an SOI substrate comprising a bottom substrate, a buried oxide (BOX) layer formed on the bottom substrate, and a top SOI layer formed on the BOX layer. A field effect transistor (FET) device is located on the top SOI layer. An undercut isolation region is located in the SOI substrate adjacent to the FET device, wherein the undercut isolation region extends through the top SOI layer and the BOX layer and into the bottom substrate underneath the BOX layer, such that a portion of the undercut isolation region is underneath a source/drain region of the FET, wherein the undercut isolation region comprises an undercut fill comprising an insulating material.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of undercut isolation regions for an SOI device are provided, with exemplary embodiments being discussed below in detail. In UTBB devices having a relatively thin BOX layer, shorts between the source/drain contacts of the FET devices and the bottom substrate may occur, as the source/drain contacts may break through the BOX layer to the bottom substrate. Formation of undercut isolation regions in the bottom substrate and filling the undercut isolation regions with an insulating material provides a relatively thick insulator at edge of the active regions, isolating the contacts from the bottom substrate and preventing such shorts. The undercut isolation regions include a thick dielectric at the edge of the channel; this dielectric extends into the bottom substrate underneath the source/drain regions. Undercut isolation regions may be formed by undercutting into the bottom substrate and filling with the dielectric material, and additionally by oxidation of the silicon that comprises the bottom substrate before filling with the dielectric material, in various embodiments.

Figure 1:
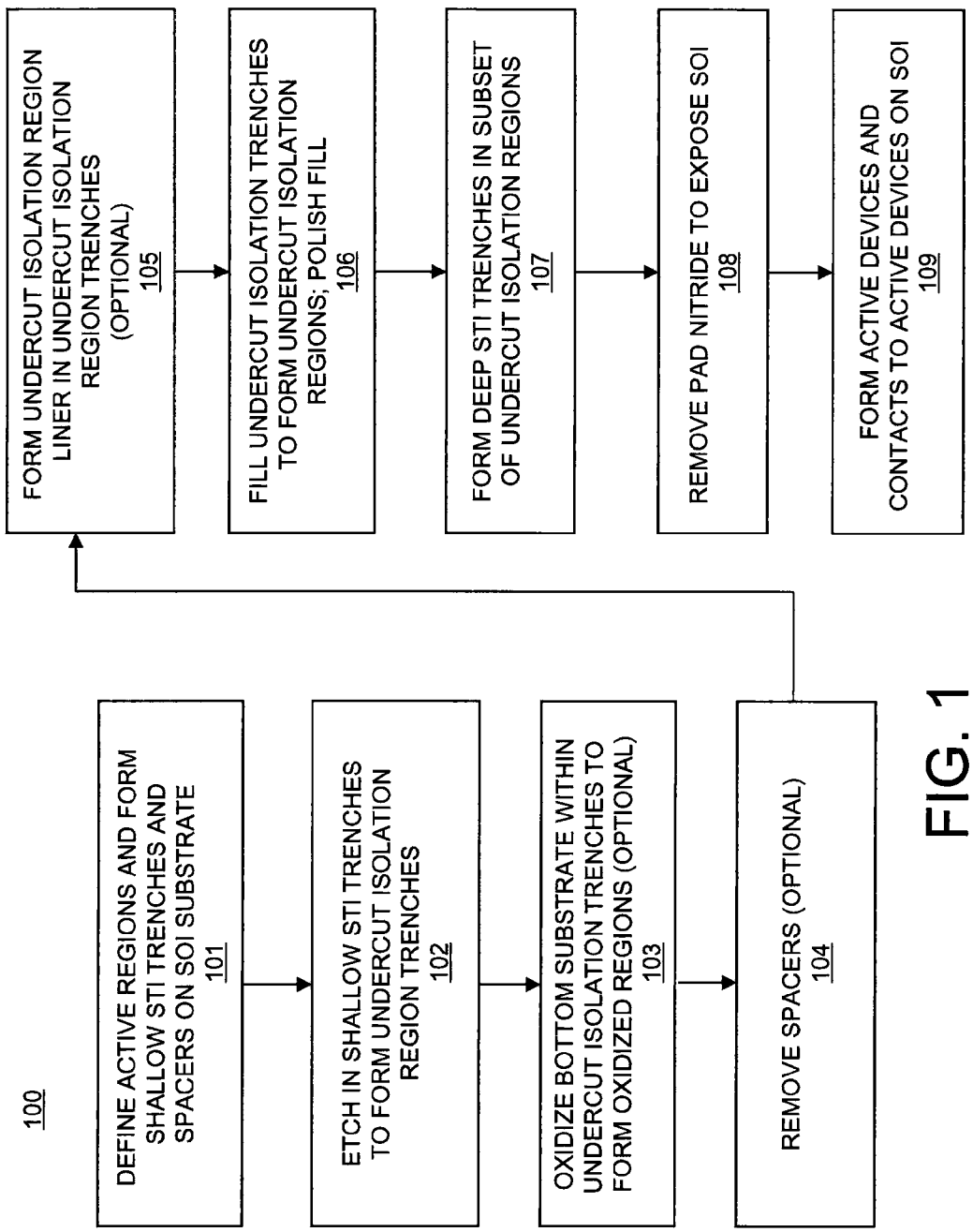
FIG. 1 is a flowchart illustrating embodiments of a method of making an undercut insulating region for an SOI device.
Figure 2:
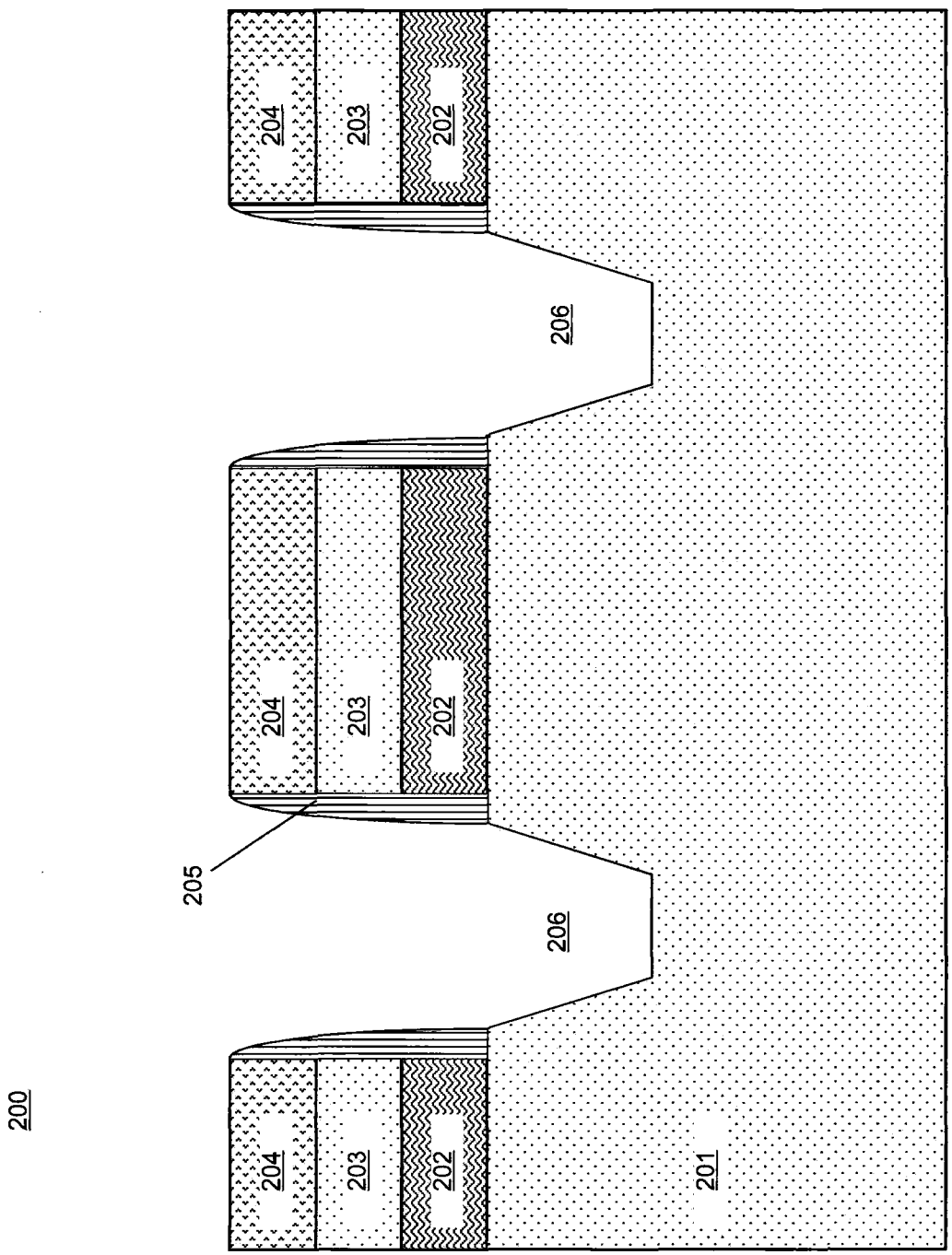
FIG. 2 is a cross sectional view of an embodiment of an SOI substrate after formation of spacers and shallow shallow trench isolation (STI) trenches.

FIG. 1 is a flowchart illustrating embodiments of a method 100 for formation of an SOI device having undercut isolation regions. A first embodiment of the process flow of method 100 of FIG. 1 that includes an undercut isolation liner is discussed with respect to blocks 101-109 of method 100 and FIGS. 2-10. A second embodiment of the process flow of method 100 of FIG. 1 that omits the undercut isolation region liner is discussed with respect to blocks 101-104 and 106-109 of method 100, and FIGS. 2-5 and 11-14. Flow of the first and second embodiments of method 100 of FIG. 1 begins in block 101, in which active areas are defined on an SOI substrate, and shallow STI trenches and spacers are formed. The active areas in the SOI regions are defined by an active region lithography step. The shallow STI trenches are formed by etching between active regions. The shallow STI trenches isolate active areas of the top SOI layer from one another, and extend through the top SOI layer and BOX into the bottom substrate. Any appropriate etch may be used to form the shallow STI trenches in block 101, for example, a dry etch such as reactive ion etching (RIE). The spacers are formed adjacent to the active regions to protect the active regions during subsequent processing. The spacers may comprise any appropriate isolating material, such as nitride or oxide, in various embodiments. FIG. 2 illustrates an embodiment of a device 200 comprising an SOI substrate with spacers 205 and shallow STI trenches 206. The device 200 includes bottom substrate 201, BOX 202, SOI 203, and pad nitride 204. The portions of SOI 203 that will be used to form active devices are protected by spacers 205 and pad nitride 204, and isolated by shallow STI trenches 206. Bottom substrate 201 and SOI 203 may comprise silicon.

Figure 3:
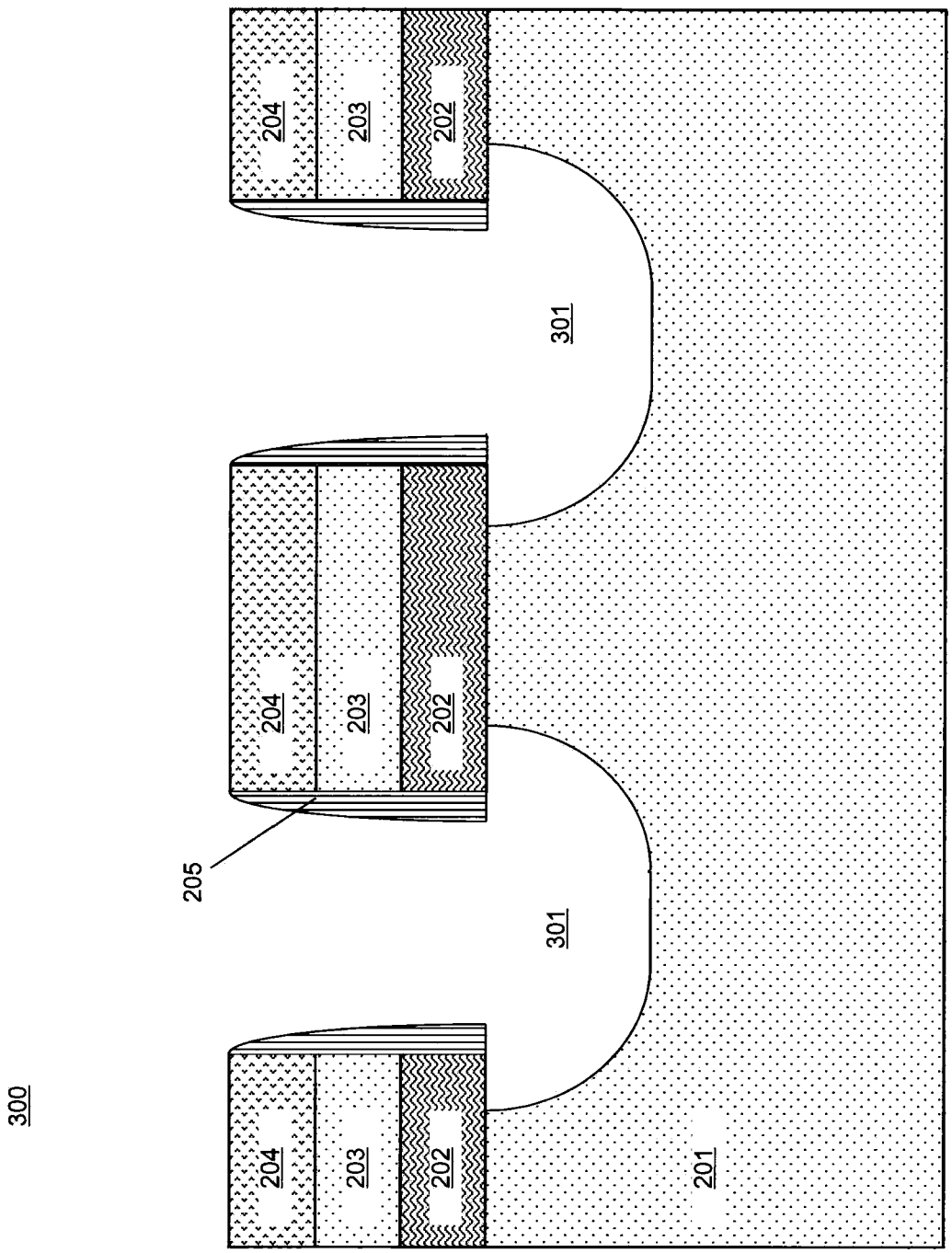
FIG. 3 is a cross sectional view of the device of FIG. 2 after formation of undercut isolation regions.

Flow of the first and second embodiments of method 100 of FIG. 1 now proceeds to block 102, in which undercut isolation trenches are formed by etching the bottom substrate on the sides of the shallow STI regions. The undercut isolation trenches extend underneath the BOX. The undercut isolation regions may be formed using any appropriate isotropic silicon etch, which may comprise a potassium hydroxide (KOH) or ammonium hydroxide ($NH_4OH$) based wet etch in some embodiments, or an isotropic dry etch such as a bromine (Br) containing chemical down stream etch in other embodiments. The etch that is performed to form the undercut isolation trenches in block 102 of FIG. 1 may be selective to the materials that comprise BOX 202, pad nitride 204, and spacers 205. FIG. 3 shows the device 200 of FIG. 2 after formation of undercut isolation trenches 301. The undercut isolation trenches 301 extend underneath the BOX 202.

Figure 4:
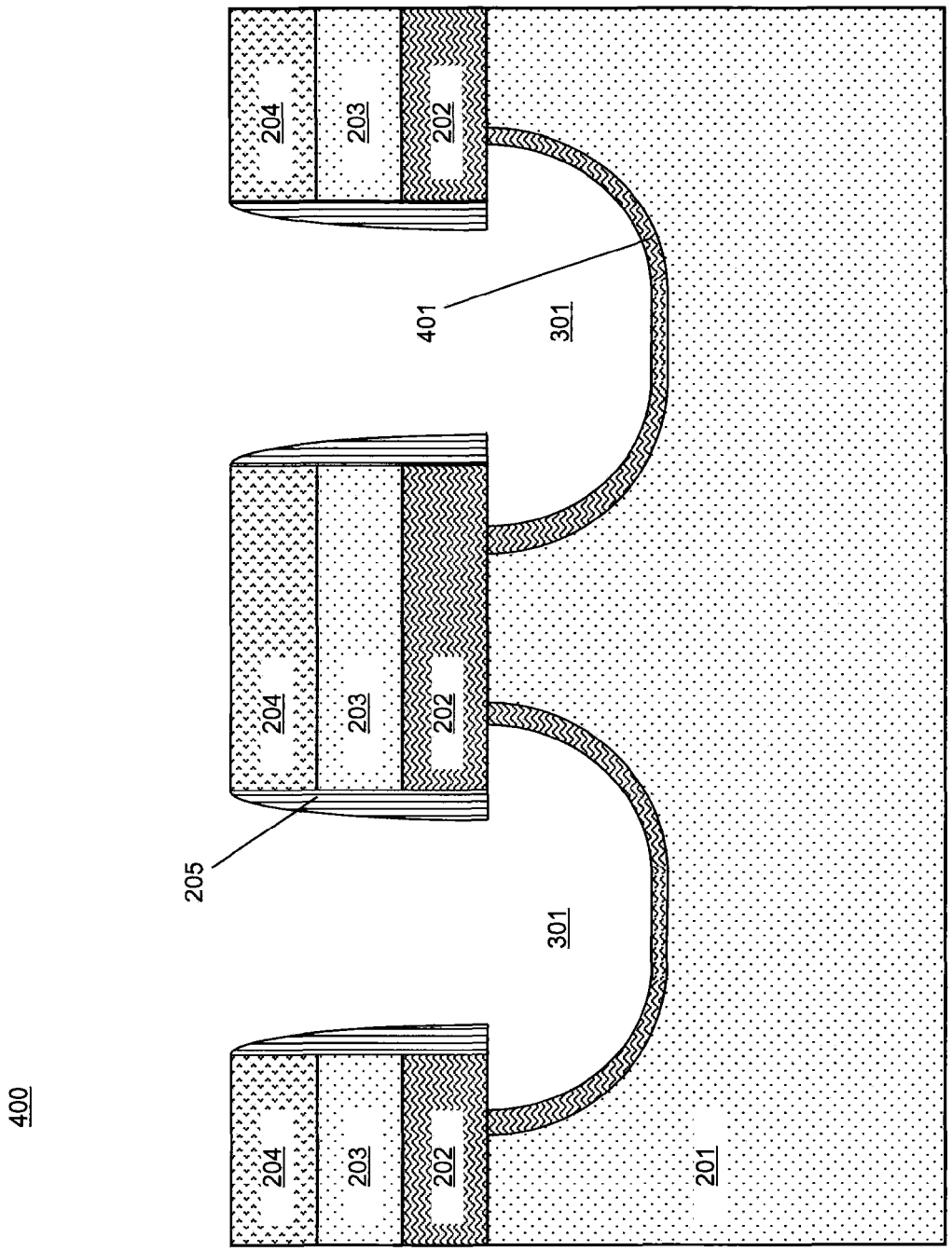
FIG. 4 is a cross sectional view of the device of FIG. 3 after formation of oxidized regions in the undercut isolation regions.

Next, in block 103 of the first and second embodiments of method 100 of FIG. 1, optional oxidized regions may be formed in the undercut isolation trenches by oxidation of the exposed bottom silicon substrate within the undercut isolation trenches. The optional oxidized regions may provide additional oxide thickness between the active regions, and may also protect the bottom substrate during further processing. In some embodiments, oxidized regions as are formed in block 103 may be omitted. FIG. 4 shows the device 300 of FIG. 3 after formation of oxidized regions 401 in the undercut isolation trenches 301. The oxidized regions 401 are formed by oxidation of bottom substrate 201, and line the interior of the undercut isolation trenches 301. The BOX 202, pad nitride 204, and spacers 205 protect the SOI 203 during formation of the oxidized regions 401.

Figure 5:
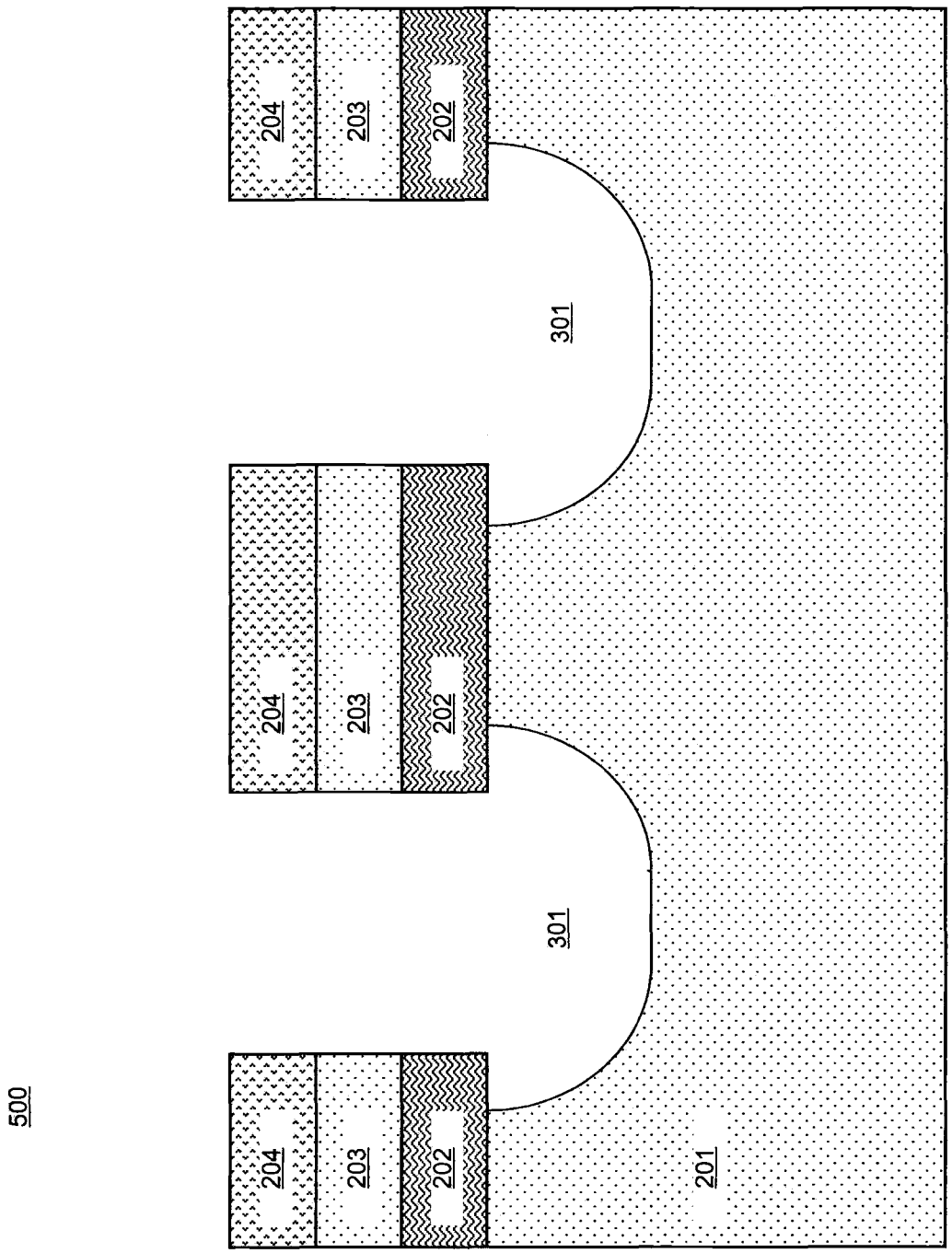
FIG. 5 is a cross sectional view of the device of FIG. 3 after spacer removal.

Continuing the flow of the first and second embodiments of method 100 of FIG. 1, in block 104 of FIG. 4, the spacers may be removed. Spacer removal as is performed in block 104 is also optional. In embodiments in which the spacers comprise oxide, spacer removal may comprise a relatively short dilute hydrofluoric acid (dHF) etch. In embodiments in which the spacers comprise nitride, spacer removal may comprise a relatively short hot phosphoric acid etch. In some embodiments, the spacer removal as is performed in block 104 may be omitted. In further embodiments, spacer removal may be performed after formation of the optional oxidized regions of block 103 of FIG. 1. FIG. 5 shows the device 300 of FIG. 3 after removal of spacers 205. While device 500 as shown in FIG. 5 does not include oxidized regions 401 as were shown in device 400 of FIG. 4, in some embodiments, oxidized regions 401 such as were shown in FIG. 4 may be included in the device 500 of FIG. 5 in the undercut isolation trenches 301.

Flow of the first embodiment of method 100 of FIG. 1 now proceeds to block 105, in which an undercut isolation region liner is formed over the device. Formation of the undercut isolation region liner in block 105 is optional, and is omitted in the second embodiment of the flow of method 100. As noted above, FIGS. 6-10 illustrate the first embodiment of method 100, including blocks 105-109, with an undercut isolation region liner as is formed in block 105, and FIGS. 11-14 illustrate the second embodiment of the flow of method 100, including blocks 106-109 without formation of an undercut isolation region liner, skipping block 105. In the first and second embodiments as illustrated by FIGS. 6-10 and FIGS. 11-14, the optional oxidized regions that were formed in block 103 are not shown; however, the optional oxidized regions may be included in the devices shown in FIGS. 6-10 and FIGS. 11-14 in some embodiments. Additionally, in the first and second embodiments as illustrated by FIGS. 6-10 and FIGS. 11-14, the optional spacer removal in block 104 was performed; however, in some embodiments, the spacers 208 as were shown in FIGS. 2-4 may be present in some embodiments of devices that are shown in FIGS. 6-10 and FIGS. 11-14.

Figure 6:
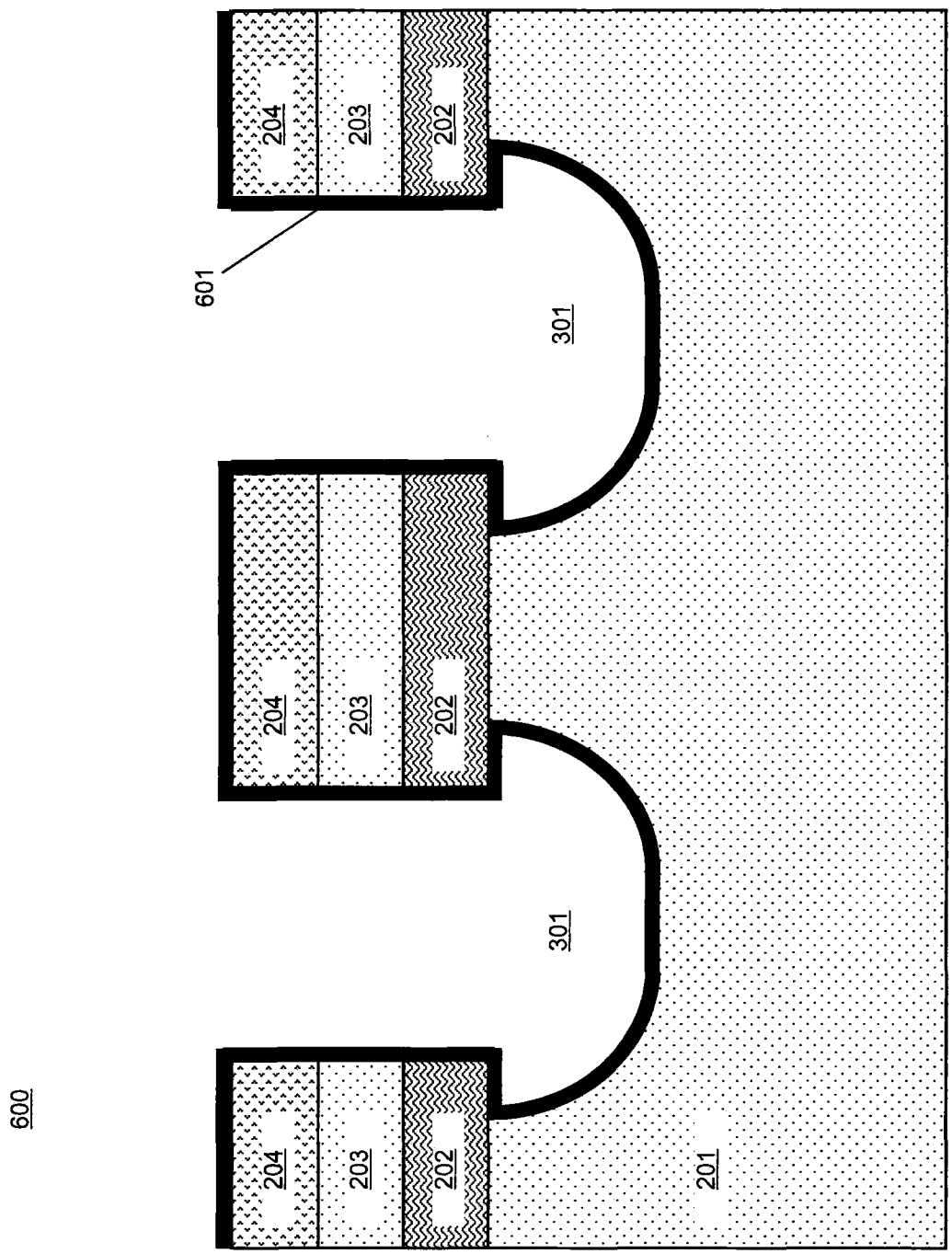
FIG. 6 is a cross sectional view of the device of FIG. 5 after formation of a liner in the undercut isolation regions.

Turning now to the first embodiment of method 100 of FIG. 1, the undercut isolation region liner that is formed in block 105 may comprise an isolating material such as hafnium oxide (HfO) or a nitride in various embodiments, and may be formed by any appropriate conformal deposition technique. FIG. 6 illustrates the device 500 of FIG. 5 after formation of the undercut isolation region liner 601. The undercut isolation region liner 601 as shown in FIG. 6 covers the bottom substrate 201 in the interior of the undercut isolation trenches 301, as well as the BOX 202, SOI 203, and pad nitride 204. In embodiments that include the optional oxidized regions 401 that were shown in FIG. 4, the oxidized regions 401 are located between the undercut isolation region liner 601 and the bottom substrate 201, such that the undercut isolation region liner 601 covers the oxidized regions 401 in the interior of the undercut isolation trenches 301. In embodiments that skip the spacer removal of block 105 of method 100, the undercut isolation region is formed over the spacers 205.

Figure 7:
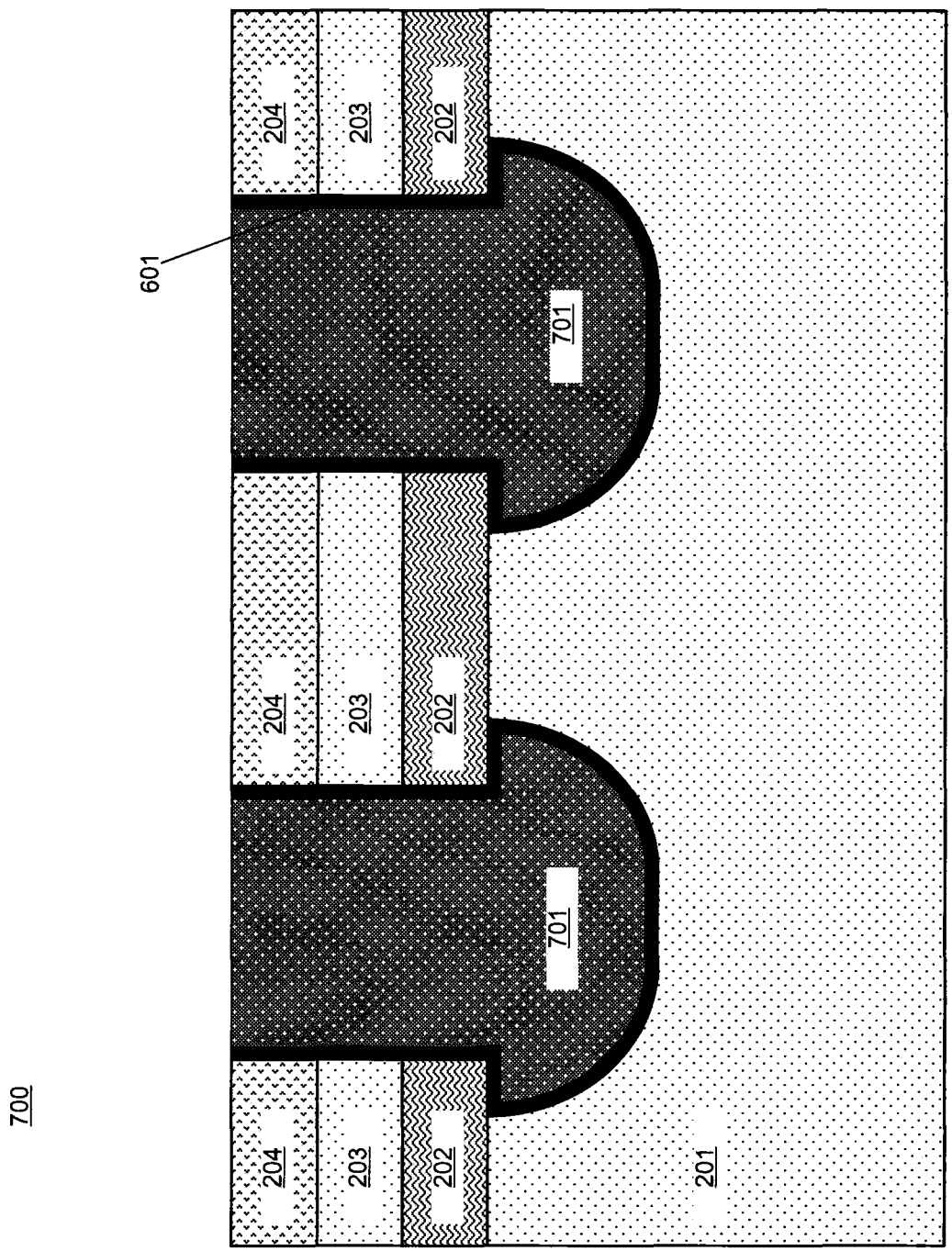
FIG. 7 is a cross sectional view of the device of FIG. 6 after formation of a fill in the undercut isolation regions.

Continuing the flow of the first embodiment of method 100 of FIG. 1, in block 106, an undercut fill is formed in the undercut isolation trenches, forming undercut isolation regions, and over the device. The fill may comprise any appropriate isolating material, including but not limited to an oxide such as silicon oxide ($SiO_2$) or HfO, and may be formed by any appropriate deposition technique. The top of the fill is then polished to the level of the top of the pad nitride, also removing the portion of the undercut isolation region liner that is located on top of the pad nitride. The polish may comprise chemical mechanical polishing (CMP) in some embodiments. FIG. 7 shows an embodiment of the device 600 of FIG. 6 after formation of filled undercut isolation regions 701 in the undercut isolation trenches 301. The fill of undercut isolation regions 701 extends into the bottom substrate 201 underneath the BOX 202, and covers the undercut isolation region liner 601. The top surface of the fill of undercut isolation regions 701 is level with the top surface of pad nitride 204, and the top surface of pad nitride 204 is exposed.

Figure 8:
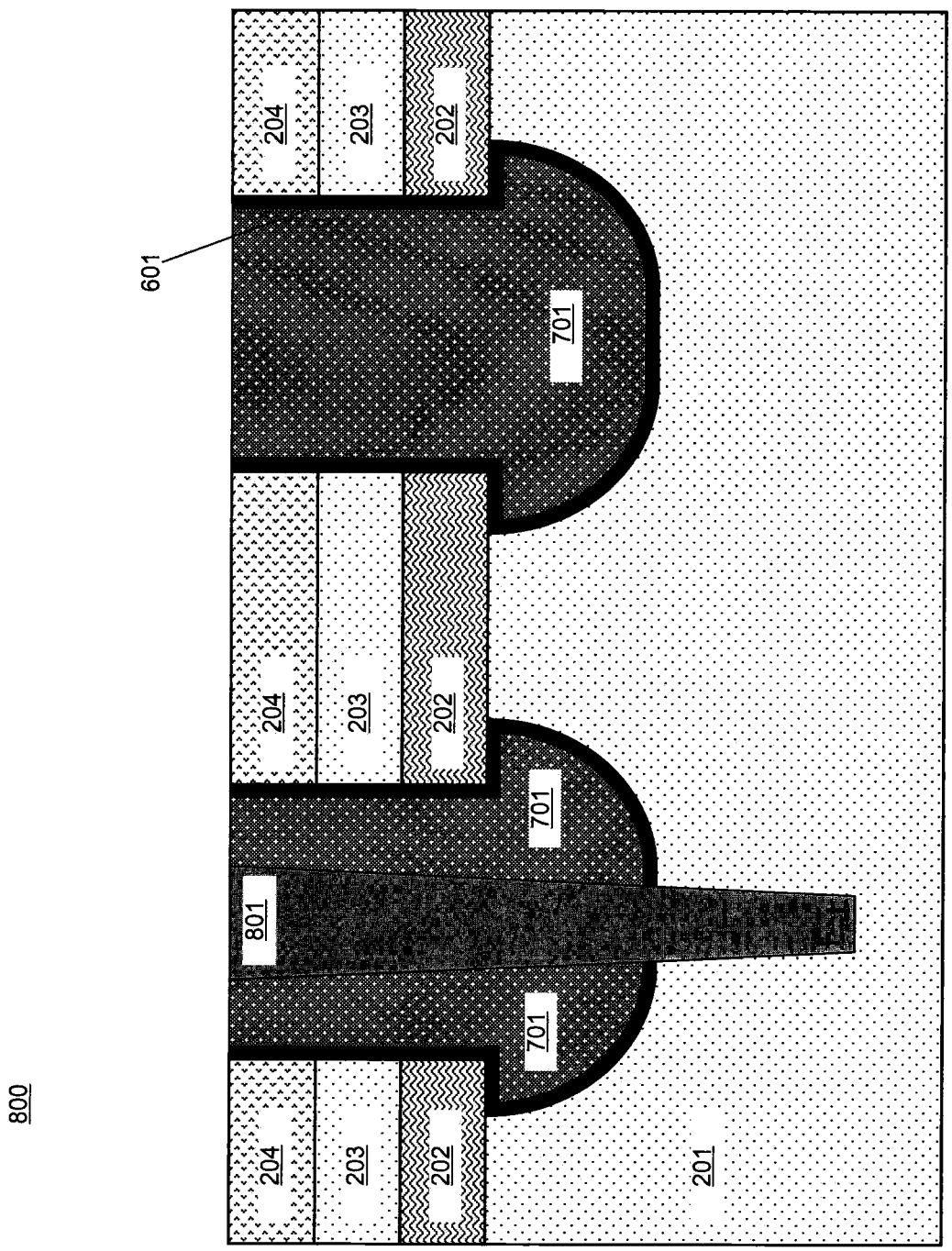
FIG. 8 is a cross sectional view of the device of FIG. 7 after formation of a deep STI region.

The flow of the first embodiment of method 100 of FIG. 1 now proceeds to block 107, in which deep STI regions are formed in a subset of the undercut isolation regions. The deep STI regions act to isolate active regions comprising p-type devices from active regions comprising n-type devices, whereas the shallower undercut isolation regions that do not include the deep STI regions provide insulation within active regions that comprise a single type of device. The deep STI regions extend farther into the bottom substrate than the undercut isolation regions, and etching of the deep STI trenches may cut through the undercut fill and undercut isolation region liner (and, in some embodiments, the oxidized regions) into the bottom substrate. The deep STI regions may be formed by any appropriate type of etch through the undercut isolation regions, the undercut isolation region liner, and the bottom substrate, followed by a deep STI region fill comprising an insulating material, which may comprise an oxide or a nitride in various embodiments. The deep STI region fill may comprise a different material from the undercut isolation region fill in some embodiments. The deep STI region fill may be polished after formation such that the top surface of the deep STI region fill is level with the pad nitride. FIG. 8 shows an embodiment of the device 700 of FIG. 7 after formation of deep STI region 801. Deep STI region 801 extends through one of the undercut isolation regions 701 into the bottom substrate 201, and comprises an insulating fill material. The top surface of the fill of deep STI region 801 is level with the top surface of pad nitride 204.

Figure 9:
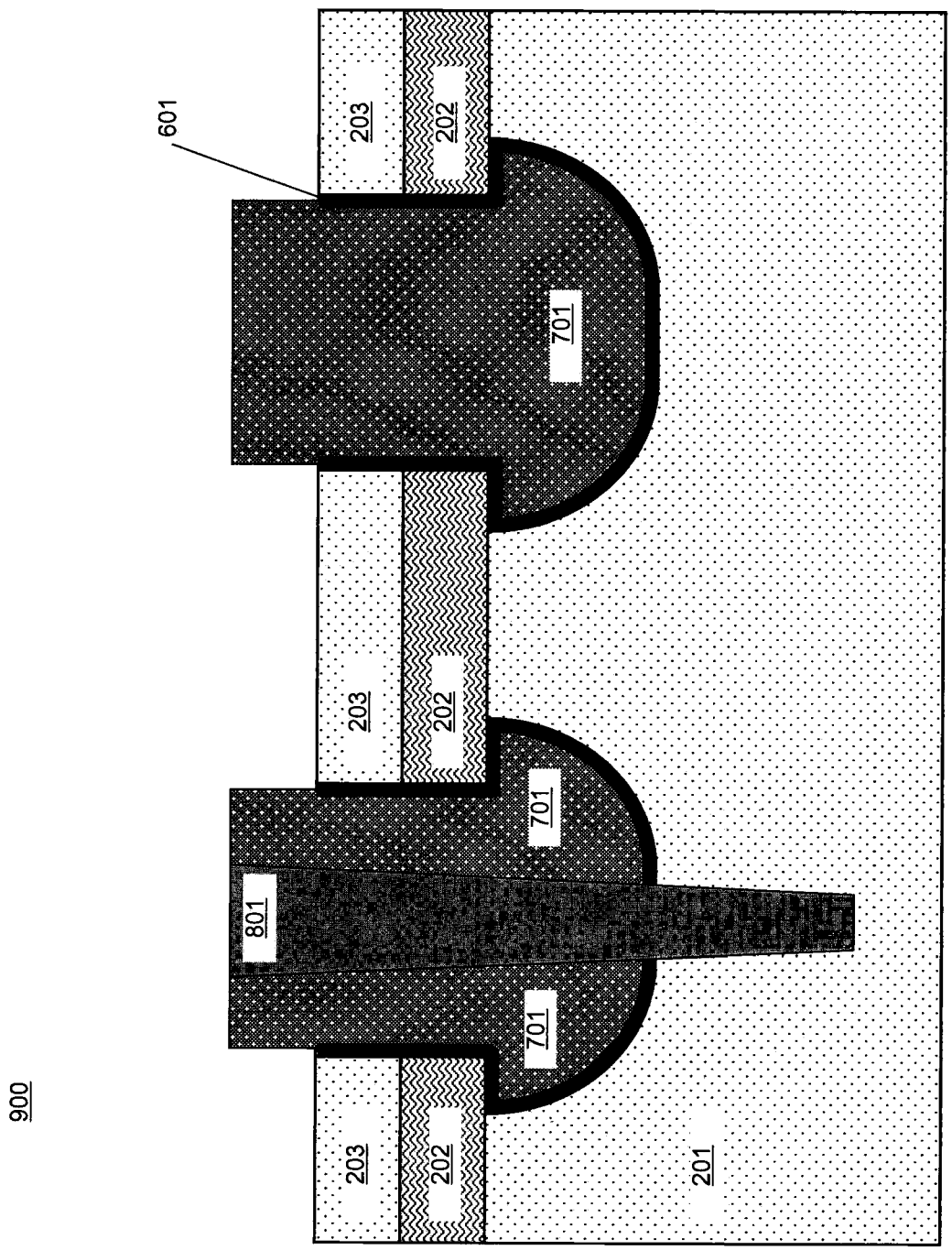
FIG. 9 is a cross sectional view of the device of FIG. 8 after pad nitride removal.

Next, the flow of the first embodiment of method 100 of FIG. 1 proceeds to block 108, in which the pad nitride is removed, exposing the SOI for formation of active devices. The pad nitride may be removed using any appropriate etch. In some embodiments, a portion of the undercut isolation region liner may also be removed by the etch of the pad nitride. Further, in some embodiments, a relatively thin layer of pad oxide may be located between the pad nitride 204 and the SOI 203; in such an embodiment, the pad oxide is also removed during block 108 of FIG. 1. FIG. 9 shows an embodiment of the device 800 of FIG. 8 after removal of pad nitride 204, exposing the top surface of SOI 203 for further processing.

Figure 10:
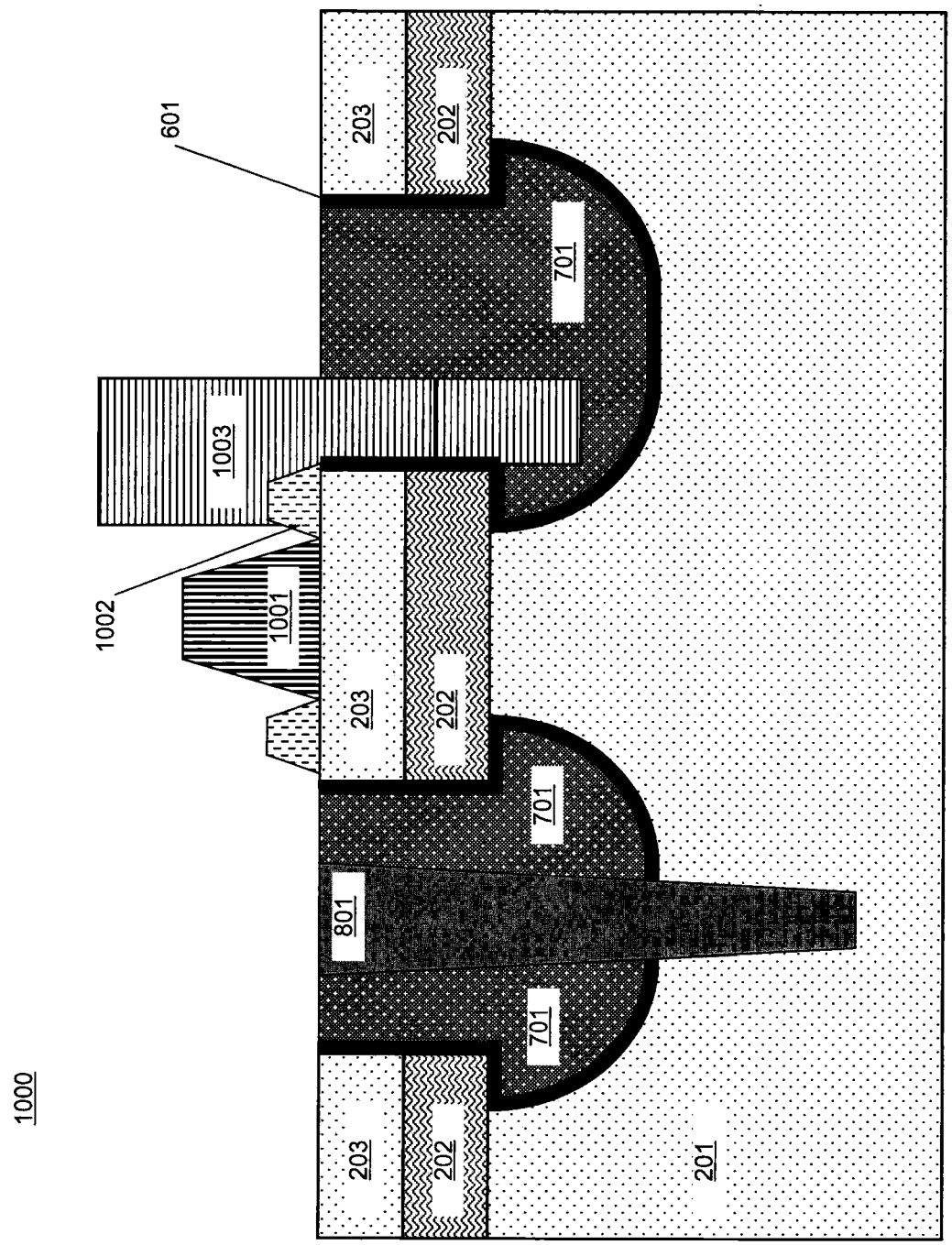
FIG. 10 is a cross sectional view of the device of FIG. 9 after device formation in the SOI layer.

Lastly, the flow of the first embodiment of method 100 of FIG. 1 proceeds to block 109, in which active devices are formed on the exposed SOI. Contacts to the active devices, including source/drain contacts and gate contacts, are also formed. The undercut isolation regions act to isolate the source/drain contacts of the active devices from the bottom substrate. The active devices may comprise any appropriate type of devices, and may be formed on the SOI using any appropriate semiconductor processing techniques. The active regions comprising the active devices are isolated from one another by the undercut isolation regions. FIG. 10 shows an embodiment of the device 900 of FIG. 9 after formation of an active device, comprising gate stack 1001 and source/drain 1002, on the SOI 203. A source/drain contact 1003 contacts source/drain 1002 and extends into an undercut isolation region 701. Because undercut isolation region 701 extends into the bottom substrate 201 underneath BOX 202, the source/drain contact 1003 is separated and isolated from the bottom substrate 201. Undercut isolation regions 701 extend underneath source/drain regions (located in SOI 203 underneath source/drain 1002) of the active device, and extends to an edge of a device channel region located in SOI 203 underneath gate stack 1001. FIG. 10 is shown for illustrative purposes only; any appropriate configuration of devices and contacts may be formed on the SOI 203. In further embodiments, the optional oxidized regions 401 as were shown in FIG. 4 may be located between the undercut isolation region liner 601 and the bottom substrate 201.

Figure 11:
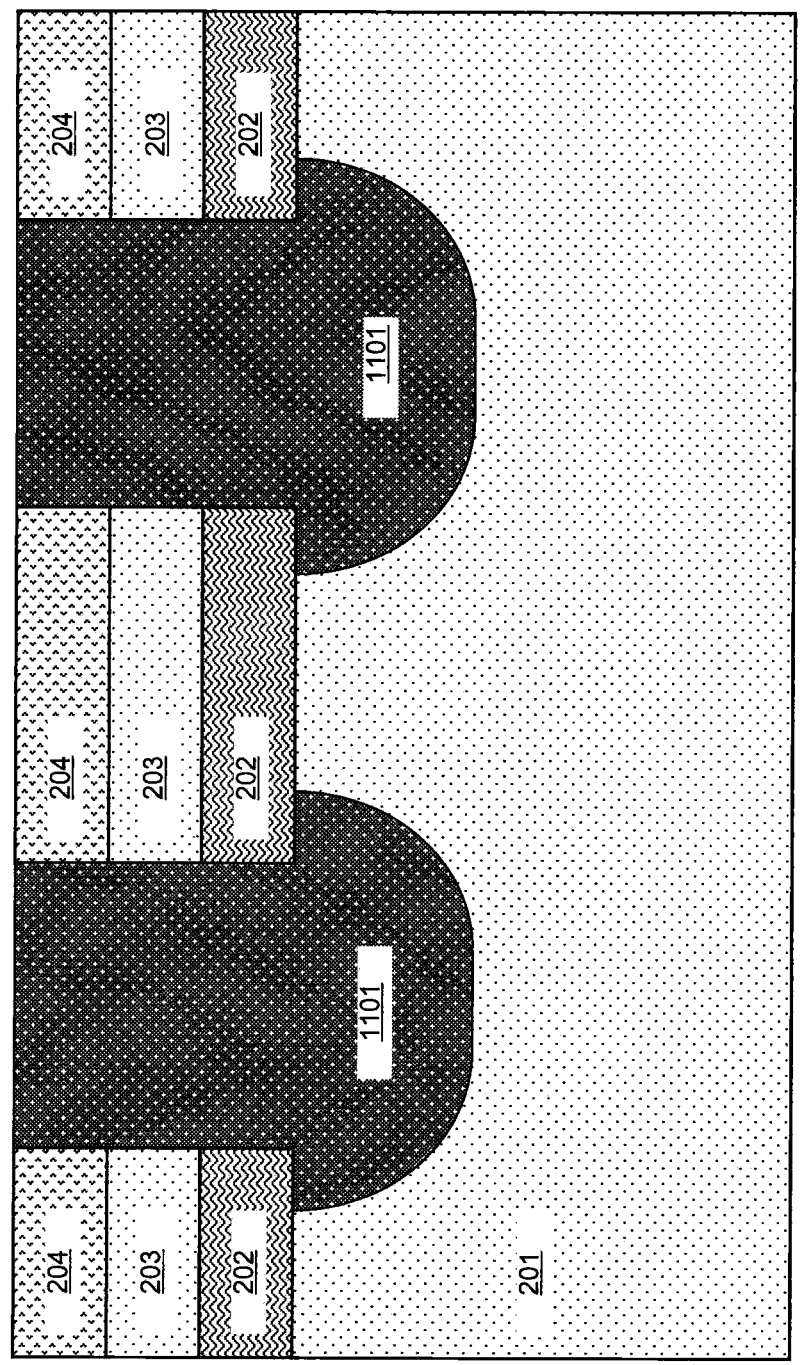
FIG. 11 is a cross sectional view of the device of FIG. 5 after formation of a fill in the undercut isolation regions.

Turning now to the second embodiment of method 100 of FIG. 1, flow proceeds from block 104 to block 106, in which an undercut fill is formed in the unlined undercut isolation trenches and over the device. The fill may comprise any appropriate isolating material, including but not limited to an oxide such as silicon oxide ($SiO_2$) or HfO, and may be formed by any appropriate deposition technique. The top of the fill is then polished to the level of the top of the pad nitride. The polish may comprise chemical mechanical polishing (CMP) in some embodiments. FIG. 11 shows an embodiment of the device 500 of FIG. 5 after formation of filled undercut isolation regions 1101 in the undercut isolation trenches 301. The fill of undercut isolation regions 1101 extends into the bottom substrate 201 underneath the BOX 202, and is formed on the bottom substrate 201 inside the undercut isolation trenches 301, as were shown in FIG. 3. The top surface of the fill of undercut isolation regions 1101 is level with the top surface of pad nitride 204, and the top surface of pad nitride 204 is exposed. In embodiments that include the optional oxidized regions 401 that were shown in FIG. 4, the oxidized regions 401 are located between the undercut isolation regions 1101 and the bottom substrate 201, such that the fill of the undercut isolation regions 1101 covers the oxidized regions 401 in the interior of the undercut isolation trenches 301.

Figure 12:
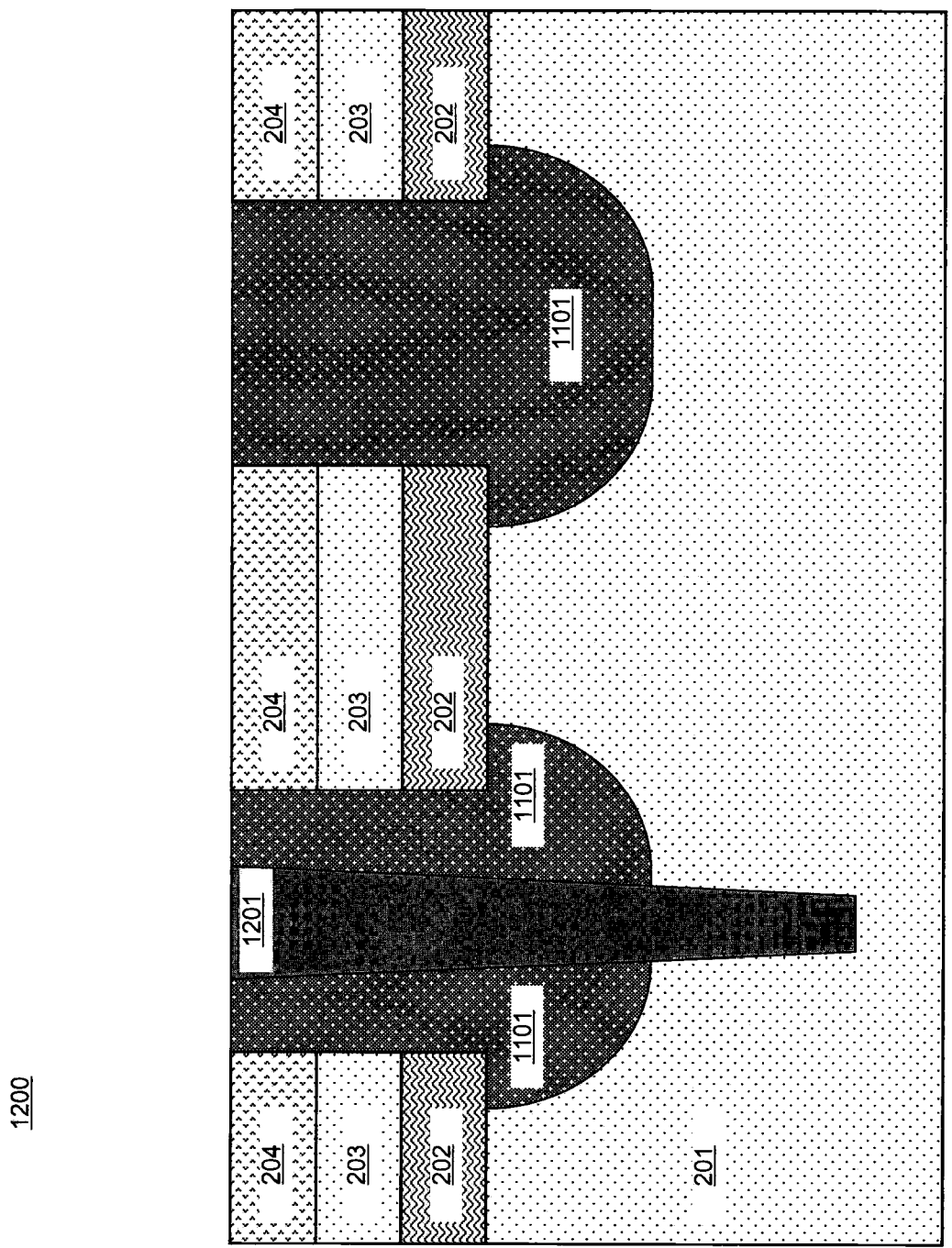
FIG. 12 is a cross sectional view of the device of FIG. 11 after formation of a deep STI region.

The flow of the second embodiment of method 100 of FIG. 1 now proceeds to block 107, in which deep STI regions are formed in a subset of the undercut isolation regions. The deep STI regions act to isolate active regions comprising p-type devices from active regions comprising n-type devices, whereas the shallower undercut isolation regions that do not include the deep STI regions provide insulation within active regions that comprise a single type of device. The deep STI regions extend farther into the bottom substrate than the undercut isolation regions, and etching of the deep STI trenches may cut through the undercut isolation regions into the bottom substrate. The deep STI regions may be formed by any appropriate type of etch through the undercut isolation regions and the bottom substrate, followed by a deep STI region fill comprising an insulating material, which may comprise an oxide or a nitride in various embodiments. The deep STI region fill may comprise a different material from the undercut isolation region fill in some embodiments. The deep STI region fill may be polished after formation such that the top surface of the deep STI region fill is level with the pad nitride. FIG. 12 shows an embodiment of the device 1100 of FIG. 11 after formation of deep STI region 1201. Deep STI region 1201 extends through one of the undercut isolation regions 1101 into the bottom substrate 201, and comprises an insulating material. The top surface of the fill of deep STI region 1201 is level with the top surface of pad nitride 204.

Figure 13:
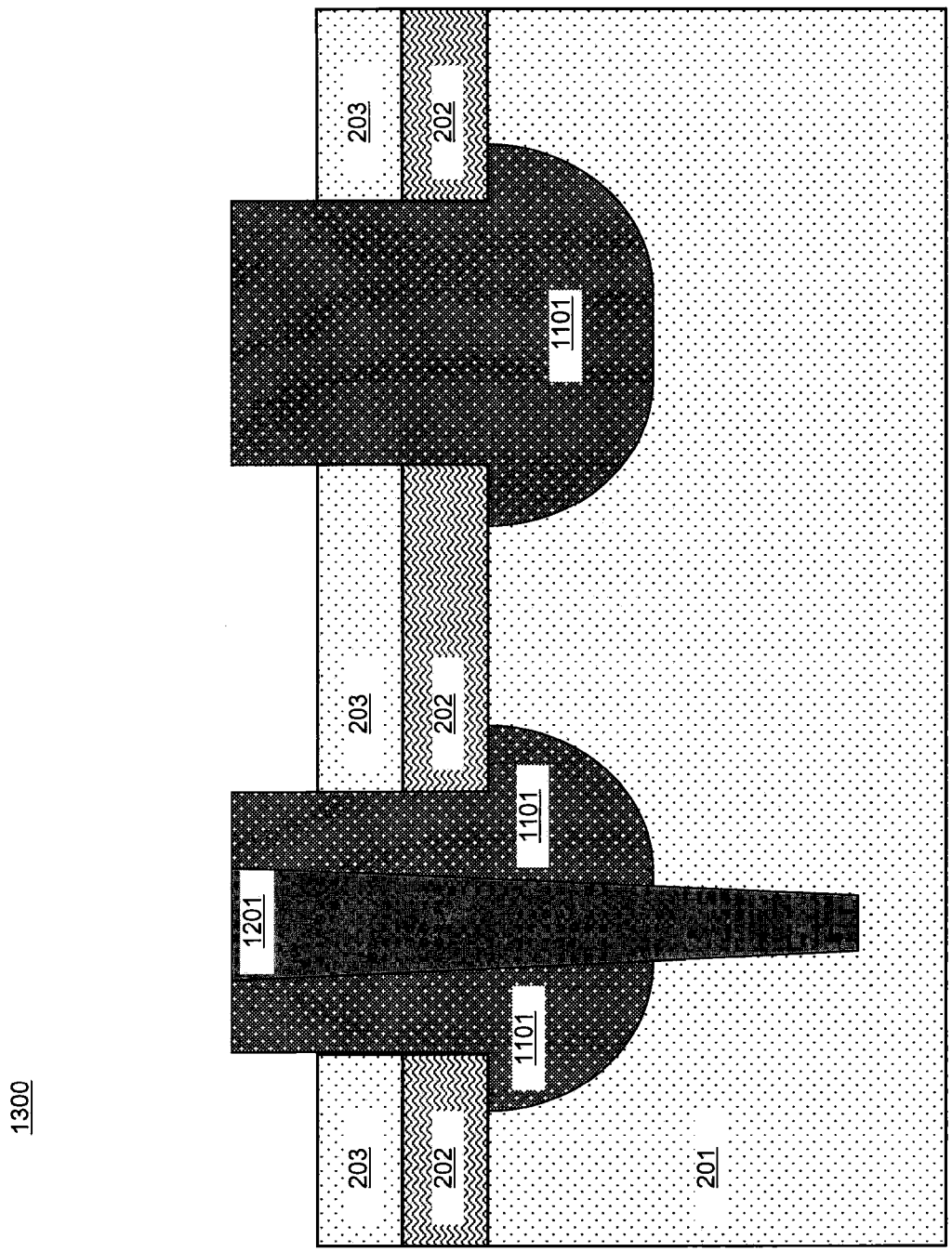
FIG. 13 is a cross sectional view of the device of FIG. 12 after pad nitride removal.

Next, the flow of the second embodiment of method 100 of FIG. 1 proceeds to block 108, in which the pad nitride is removed, exposing the SOI for formation of active devices. The pad nitride may be removed using any appropriate etch. FIG. 13 shows an embodiment of the device 1200 of FIG. 12 after removal of pad nitride 204, exposing the top surface of SOI 203 for further processing.

Figure 14:
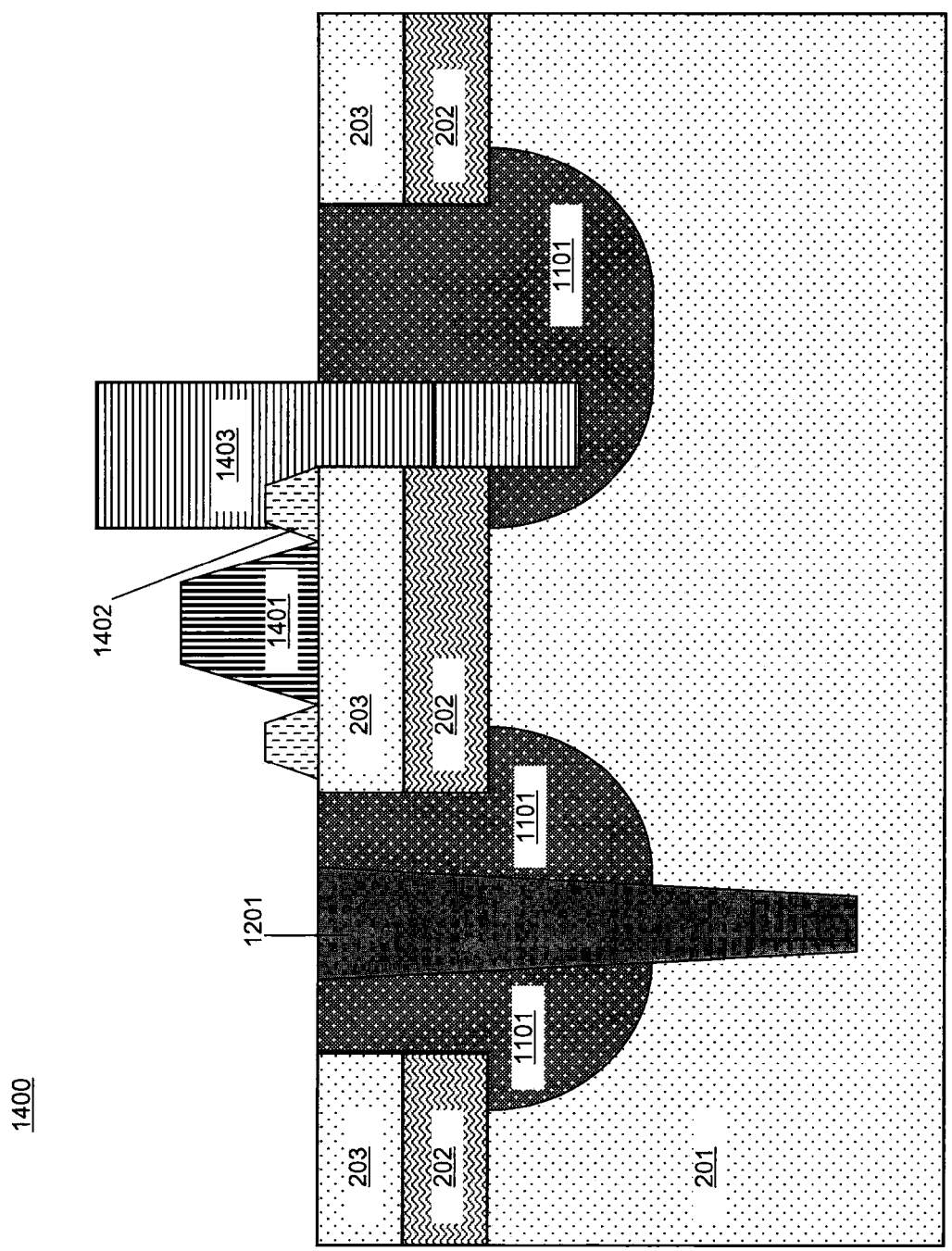
FIG. 14 is a cross sectional view of the device of FIG. 13 after device formation in the SOI layer.

Lastly, the flow of the second embodiment of method 100 of FIG. 1 proceeds to block 109, in which active devices are formed on the exposed SOI. Contacts to the active devices, including source/drain contacts and gate contacts, are also formed. The undercut isolation regions act to isolate the source/drain contacts of the active devices from the bottom substrate. The active devices may comprise any appropriate type of devices, and may be formed on the SOI using any appropriate semiconductor processing techniques. The active regions comprising the active devices are isolated from one another by the undercut isolation regions. FIG. 14 shows an embodiment of the device 1300 of FIG. 13 after formation of an active device, comprising gate stack 1401 and source/drain 1402, on the SOI 203. Source/drain contact 1403 contacts source/drain 1402 and extends into an undercut isolation region 1101. Because undercut isolation region 1101 extends into the bottom substrate 201 underneath BOX 202, the source/drain contact 1003 is separated and isolated from the bottom substrate 201. Undercut isolation regions 1101 extend underneath source/drain regions (located in SOI 203 underneath source/drain 1402) of the active device, and extends to an edge of a device channel region located in SOI 203 underneath gate stack 1401. FIG. 14 is shown for illustrative purposes only; any appropriate configuration of devices and contacts may be formed on the SOI 203. In further embodiments, the optional oxidized regions 401 as were shown in FIG. 4 may be located between the undercut isolation regions 1101 and the bottom substrate 201.

The technical effects and benefits of exemplary embodiments include prevention of shorts between source/drain contacts and the bottom substrate in an SOI device.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A silicon-on-insulator (SOI) semiconductor device, comprising:
an SOI substrate comprising a bottom substrate, a buried oxide (BOX) layer formed on the bottom substrate, and a top SOI layer formed on the BOX layer;
a field effect transistor (FET) device located on the top SOI layer; and
an undercut isolation region located in the SOI substrate adjacent to the FET device, wherein the undercut isolation region extends through the top SOI layer and the BOX layer and into the bottom substrate underneath the BOX layer, such that a portion of the undercut isolation region is underneath a source/drain region of the FET, wherein the undercut isolation region comprises an undercut fill comprising an insulator material;
a source/drain contact having a portion disposed above a top surface of a source/drain region of the FET, the source/drain contact extending into the undercut isolation region and below a bottom surface of the BOX layer.

2. The device of claim 1, further comprising an oxidized region in the bottom substrate located between the undercut isolation region and the bottom substrate.

3. The device of claim 1, wherein the undercut isolation region further comprises an undercut isolation region liner located between the undercut fill and the bottom substrate.

4. The device of claim 3, wherein the undercut isolation region liner comprises one of hafnium oxide and nitride.

5. The device of claim 1, further comprising a deep STI region located in the undercut isolation region, wherein the deep STI region extends deeper into the bottom substrate than the undercut isolation region.

6. The device of claim 5, wherein the deep STI region comprises an insulating fill material that is different from the undercut fill.

7. The device of claim 1, wherein the source/drain contact is separated from the bottom substrate by the undercut fill so as to prevent shorting between the source/drain contact and the bottom substrate.

* * * * *